United States Patent
Wang et al.

(10) Patent No.: US 6,780,243 B1
(45) Date of Patent: Aug. 24, 2004

(54) METHOD OF SILICON CARBIDE MONOCRYSTALLINE BOULE GROWTH

(75) Inventors: Shaoping Wang, Brookfield, CT (US); Aneta Kopec, Bethel, CT (US); Rodd Mitchell Ware, Danbury, CT (US); Sonia Holmes, Danbury, CT (US)

(73) Assignee: Dow Corning Enterprises, Inc., Auburn, MI (US)

( * ) Notice: Subject to any disclaimer, the term of this patent is extended or adjusted under 35 U.S.C. 154(b) by 40 days.

(21) Appl. No.: 10/035,672

(22) Filed: Nov. 1, 2001

(51) Int. Cl.$^7$ .............................................. C30B 23/06
(52) U.S. Cl. ........................................ 117/105; 117/84
(58) Field of Search ................................... 117/84, 105

(56) References Cited

U.S. PATENT DOCUMENTS

| | | | |
|---|---|---|---|
| 4,866,005 A | | 9/1989 | Davis et al. |
| RE34,861 E | | 2/1995 | Davis et al. |
| 5,433,167 A | * | 7/1995 | Furukawa et al. ............ 117/84 |
| 5,441,011 A | | 8/1995 | Takahaski et al. |
| 5,611,955 A | * | 3/1997 | Barrett et al. .......... 252/62.3 C |
| 5,746,827 A | | 5/1998 | Barrett et al. |
| 5,958,132 A | * | 9/1999 | Takahashi et al. ............ 117/84 |
| 5,968,261 A | | 10/1999 | Barrett et al. |
| 6,045,613 A | * | 4/2000 | Hunter ........................ 117/84 |
| 6,261,363 B1 | * | 7/2001 | Vodakov et al. ............ 117/104 |

FOREIGN PATENT DOCUMENTS

| | | |
|---|---|---|
| EP | 0 712 150 A1 | 5/1996 |
| EP | 1 143 493 A2 | 10/2001 |
| WO | WO 01/04391 A1 | 1/2001 |

OTHER PUBLICATIONS

N. Schulze et al., "Near-equilibrium growth of micropipe-free 6H–SiC single crystals by physical vapor transport" Applied Physics Letters, Vo. 72, No. 13, Mar. 30, 1998, pp. 1632–1634.

Material Science—Silicon Carbide (www.ifm.liu.se/matephys/AAnew/research/siepart/sicindex.html), Aug. 28, 2001, 22 pgs.

Calvin H. Carter, Jr. et al. "Silicon Carbide and Related Materials—1999"Materials Science Forum, vol. 338 to 342, Proceedings of the International Conference on Silicon Carbide and Related Materials, Research Triangle Park, North Carolona, USA Oct. 10–15, 1999, pp. 1786.

* cited by examiner

*Primary Examiner*—Nadine G. Norton
*Assistant Examiner*—Matthew A. Anderson
(74) *Attorney, Agent, or Firm*—Piper Rudnick LLP (57) ABSTRACT

A method of growing a silicon carbide single crystal on a silicon carbide seed crystal in an inert gas environment includes the step of raising the seed crystal temperature to a growth temperature $T_{seed}$ and raising the temperature of source material to a growth temperature $T_{source}$ that is lower than $T_{seed}$ to define a thermal gradient therebetween. The process also requires maintaining constant seed temperature and constant source temperature throughout substantially the entire growth period of the single crystal. The growth period begins when the seed crystal and source material reach $T_{seed}$ and $T_{source}$. Another step requires changing only the pressure of the inert gas during the growth period to control the growth rate of the crystal rather than changing any temperatures to control the growth rate once growth of the single crystal has started.

22 Claims, 5 Drawing Sheets

METHOD OF SILICON CARBIDE MONOCRYSTALLINE BOULE GROWTH

FIELD OF THE INVENTION

The present invention relates to methods of producing large, single crystals of silicon carbide with high crystalline quality suitable for use in semiconductor devices.

BACKGROUND OF THE INVENTION

Silicon carbide (SiC) has a wide band gap, high stability and high thermal operating range that makes it a suitable material as a semiconductor for fabricating light sources, photodiodes, power diodes, field-effect transistors (FETs) and other semiconductor devices. In order to manufacture these semiconductor devices, the SiC is provided as large single crystals which are used to make SiC wafers. The quality of the semiconductor is highly dependent on the purity and structural characteristics of the silicon carbide single crystals.

One known process is commonly referred to as physical vapor transport (PVT) or the modified Lely method. This includes placing a SiC source material separated at a controlled distance from an SiC seed within a graphite crucible containing an inert gas such as argon. The gas is initially kept at a high pressure until the growth temperatures are obtained, and then the pressure is lowered to permit sublimation, mass transport of the source material in the form of vapor species ($SiC_2$, $Si_2C$, SiC and Si molecules), and then condensation and nucleation on the seed crystal. The source material and seed crystal are maintained at different temperatures (seed being at a lower temperature than source) to cause the mass transport of the vapor species from its original location to the seed crystal for condensation. When a grown single crystal is large enough or after a predetermined set time period, the temperatures are lowered and the gas pressure is raised to stop the growth. While some prior art methods attempt to provide constant temperatures, the crystal quality would decrease in the later stages of crystal growth when the source material approaches depletion, causing changes in temperature within the crucible and in turn affecting the structural integrity of the growing single crystal.

U.S. Pat. No. 4,866,005 to Davis et al., which corresponds to U.S. Pat. No. RE 34,861, European Patent Application Publication No. EPO 712150A 1 and European Application Publication No. 1143493A 1, discloses that controlling the polytype of the SiC source material, particularly SiC source powder, and controlling the flux of the source material improves the crystal quality even at the later stages of growth. The constant flux is also stated as constant flow of vaporized Si, $Si_2C$ and $SiC_2$ per unit area per unit time. The flux of the source material to the seed can be controlled initially by maintaining constant temperatures, and when high temperature source material is used up or decreases, by changing the thermal gradient between source and seed (° C./cm) by increasing the temperature of the source material or decreasing the distance between the source and seed. This provides for growth even after a high temperature portion of the source material runs out. Davis also teaches that pressure should be maintained at 10 Torr throughout growth. This process, however, is very cumbersome because it requires the monitoring of the flux of the source material to ensure constant flux.

U.S. Pat. No. 5,441,011 to Takahaski et al. discloses an improvement over the '005 patent in that it teaches production of high quality crystal, also without a mix of polytypes, and that will grow at slower growth rates. To achieve this, however, initially the growth rate must be very high to avoid or outgrow black linear defects. Thus, it is disclosed that the source powder temperature should start and be maintained at an extremely high temperature and then be decreased continually throughout growth, which reduces the growth rate. The temperature of the seed crystal is fixed or decreases gradually so that the thermal gradient decreases gradually. The '011 patent teaches that pressure is reduced from 600 Torr to 2 to 50 Torr (preferably 10 to 20 Torr) to instigate growth and the final pressure is maintained throughout growth to obtain a growth rate of in 0.2 to 2.5 mm/hr (preferably 0.4 to 1.6 mm/hr).

U.S. Pat. No. 5,968,261 is mainly directed to an improved crucible configuration that maintains nucleation on the seed crystal while eliminating uncontrolled nucleation on the carbon crucible surfaces during growth. This process places the seed on a stepped surface and/or uses an insulation pad to prevent source material contact with the crucible surfaces. The '261 patent also discloses that the argon gas should be filled to a pressure over 100 Torr but less than atmospheric pressure because nucleation is initiated at 100 Torr. Then the temperatures are raised to 2100 to 2400° C. at a gradient 10° to 60° C./cm and are held constant. Next, the pressure is decreased to increase the growth rate, and is then held at a final pressure between 0.1 to 50 Torr. While the '261 patent discloses a way to eliminate unintentional nucleation and growth, it does not disclose how to increase the quality of the crystal by eliminating more of the defects in the SiC crystal.

In an article entitled "Near-equilibrium growth of micropipe-free 6H-SiC single crystals by physical vapor transport" by Schultze et al., a very specific four step process for growing SiC large single crystals is taught that claims to eliminate micropipes. Step 1 includes providing both the seed and source temperature at 2150° C. (at thermal equilibrium) in a Lely furnace so that no thermal gradient exists while maintaining a very high argon pressure (well over 820 mbar) that prevents sublimation of the source material. While no transport of source material occurs at this step, it is claimed that lateral transport on the seed crystal itself exists and surface defects, e.g. polishing scratches and other visible surface defects, are annealed out. Step 2 includes lowering the pressure to 30 mbar (about 23 Torr) to provide a very low growth rate (about 0.23 mm/hr). Even though no thermal gradient was provided, growth occurred. The disclosure assumes that the partial pressure of silicon above the source material that was initially higher than the partial pressure at the seed caused the growth. However, this is highly speculative. Step 3 includes raising the temperature of the source material to 2180° C. to provide a thermal gradient of 5 K/cm to increase the growth rate to an acceptable level while maintaining the pressure at 30 mbar. This step yielded growth at about 0.09 mm/hr. Finally, the preferred Step 4 included maintaining the same temperatures but lowering the pressure to 5 mbar to raise the growth rate. Again, it is claimed that no precipitates, defects or micropipes are formed and a growth rate of 0.27 mm/hr was achieved.

While the Schulze article asserts that it can eliminate micropipes, the change in temperature during the growth step causes other structural defects in the crystal. Specifically, any change in temperature during growth causes a change in polytype structures (such as 3C or 6H). A semiconductor with multiple polytypes causes variations or inconsistencies in crystal characteristics and quality.

SUMMARY OF THE INVENTION

In order to provide a crystal of consistent quality and characteristics in a process that does not require the monitoring, generating and maintaining of a substantially constant flow of vaporized Si, Si$_2$C, and SiC$_2$ per unit area per unit time from the source, and in fact intentionally varies the flow of the vaporized SiC, in one aspect of the present invention, a constant temperature process is used that carefully controls SiC single crystal growth by varying the pressure to vary the growth rate rather than using the temperature to vary the growth rate. Growth rate is measured as mass or volume increase per unit time. Such a system provides excellent control of the growth rate of the crystal while providing a relatively non-varying supply of SiC vapor species. Specifically, a method of growing a silicon carbide single crystal on a silicon carbide seed crystal in an inert gas environment includes the step of establishing the seed crystal temperature at a growth temperature $T_{seed}$ and establishing the temperature of source material at a growth temperature $T_{source}$ that is higher than $T_{seed}$ to define a thermal gradient therebetween. The process also requires maintaining constant seed temperature and constant source temperature throughout substantially the entire growth period of the single crystal. The growth period begins when the seed crystal and source material reach $T_{seed}$ and $T_{source}$, respectively. Another step requires changing the pressure of the inert gas during the growth period to control the growth rate of the crystal without changing any temperatures once growth of the single crystal has started.

In another aspect of the present invention, it has been determined that the use of an initial low growth rate prevents introduction of growth defects at the seed/crystal interface and grows a base for the single crystal with a very low amount of defects. After the crystal base is established, a higher growth rate is provided to grow the remainder of the single crystal, which results in a very high quality SiC single crystal. The different growth rates are achieved by providing an initially higher gas pressure for base growth before lowering the gas pressure to increase the growth rate—all under essentially constant temperature. More particularly, as part of the step of decreasing the pressure, the present invention also includes a step or substep reducing the pressure to a first pressure $P_0$, where transport of SiC source material to the seed still occurs at very low rates, and holding the pressure at $P_0$ for a duration which is adequate to grow a low defect base for the crystal on the seed. After growing the base, the pressure is reduced again to a second pressure $P_1$ to continue growing the remainder of the single crystal.

BRIEF DESCRIPTION OF THE DRAWINGS

The above mentioned and other features of the present invention and the manner of obtaining them will be apparent, and the invention itself will be best understood by reference to the following description of the preferred embodiment of the invention in conjunction with the drawings, in which.

DETAILED DESCRIPTION

Three related parameters are used to control SiC monocrystalline boule growth: (1) temperature (of seed crystal and source material), (2) thermal gradient (between the seed crystal and source material) and (3) gas pressure. In order to provide a substantially consistent polytype throughout a grown single crystal, the temperature and thermal gradient should be held constant. This leaves pressure to control the growth rate of the single crystal. When the pressure of the inert gas within a crucible is sufficiently high, the collisions of SiC vapor molecules or "vapor species" (specifically Si, Si$_2$C and SiC$_2$) with the inert gas atoms result in blockage that prevents the SiC vapor species from reaching and condensing on the seed crystal or growing single crystal, even when the seed crystal and source material are at growth temperatures. The crystal growth rate is roughly an inverse function to the inert gas pressure; the lower the pressure, the higher the growth rate, and therefore, the pressure can be used to provide varying desired growth rates during a single growth cycle or period. In addition, in contrast to the temperature, the inert gas pressure is much less of an inertial parameter. It is easy to control the gas pressure, and in turn growth rate, by regulating inert gas flow using vacuum pumps and flow regulators.

Figure 1:
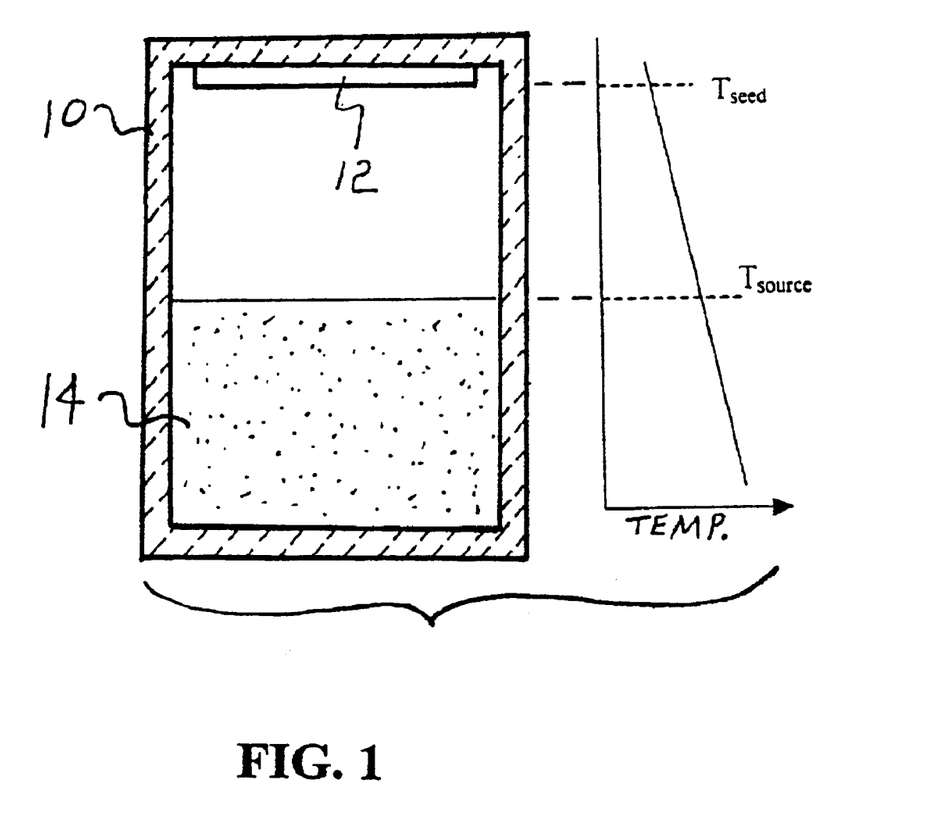
FIG. 1 is a simplified cross-sectional view of the crucible in accordance with one step of the method of the present invention.
Figure 6:
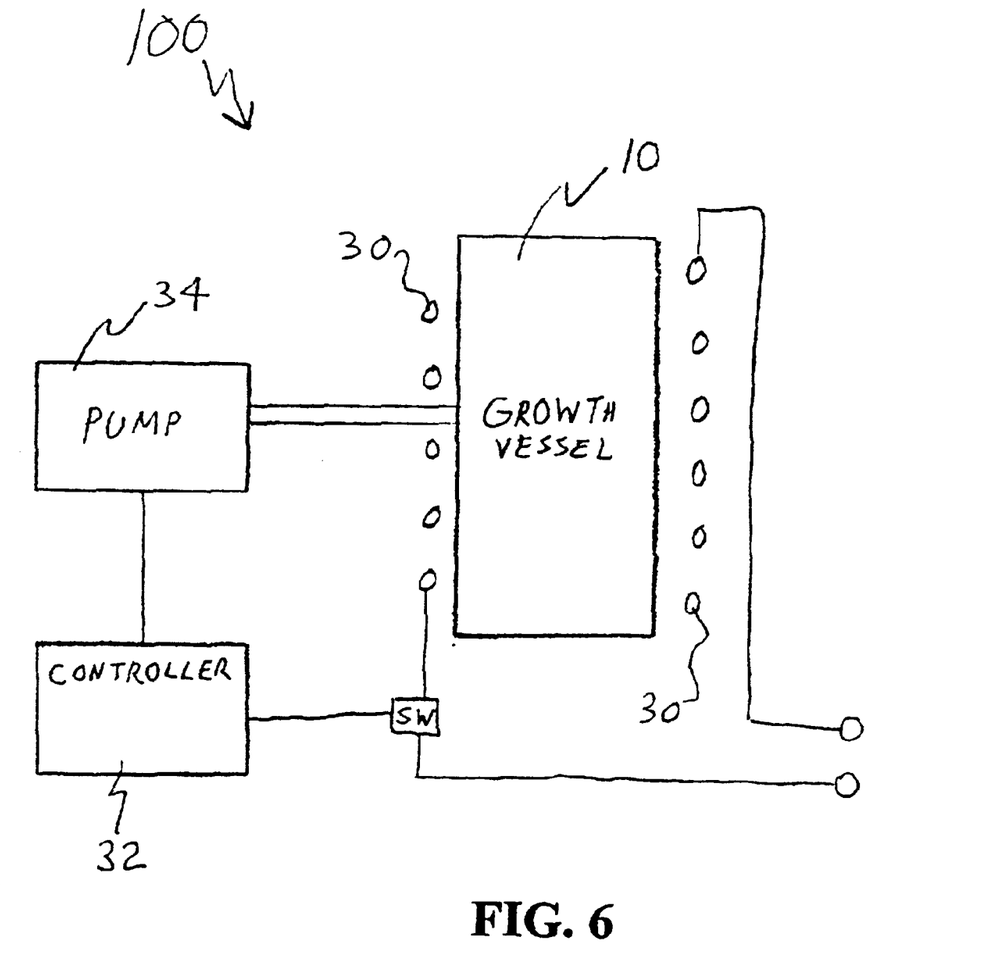
FIG. 6 is a block diagram showing the system used in accordance with the present invention.

Referring to FIGS. 1–4 and 6, a growth system 100 has a SiC crystal growth chamber such as a graphite vessel or crucible 10 or its equivalent. As shown in FIG. 1, the crucible 10 has a SiC crystal seed 12 that is separated from a SiC source 14. The source material 14 may be in powder or solid form. Referring to FIG. 6, the crucible 10 is resistor heated or RF heated by induction coils 30 wound around the outside of the crucible which in turn is within a susceptor (not shown) as known in the art. A controller 32 is provided to automatically adjust the temperature and pressures in the growth system. The controller 32 is connected to the induction coils 30 and a pump 34 to provide gas to the crucible 10 and to maintain very low gas pressures. Of course any other heating system that can maintain a thermal gradient within the crucible 10 at the required temperatures is adequate.

Figure 5:
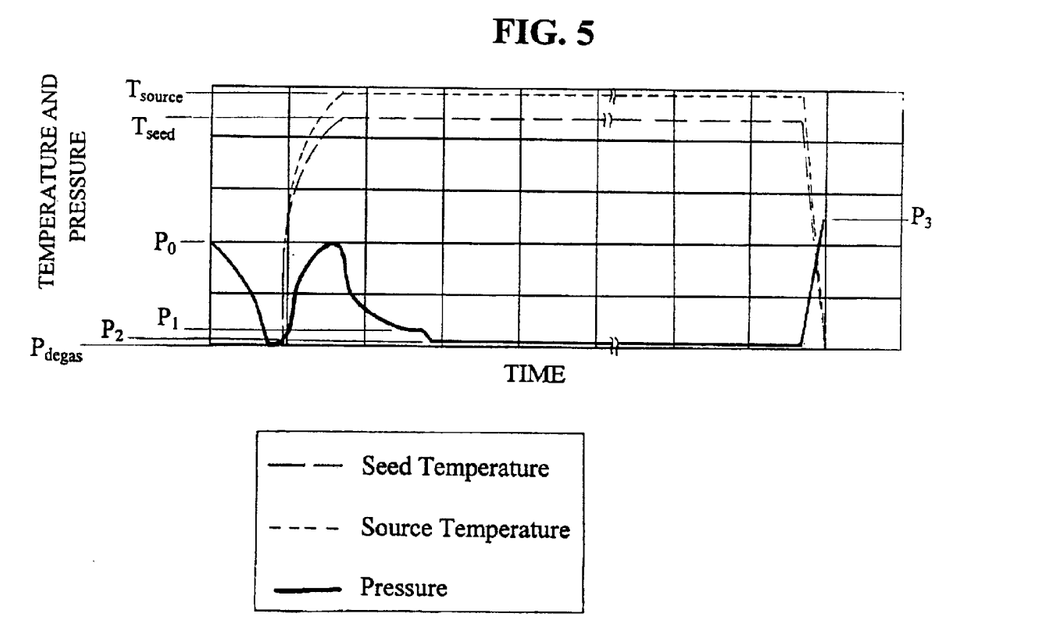
FIG. 5 is a chart showing simplified parameters used for the method of the present invention.

After the seed crystal 12 and the source material 14 are placed in the crucible 10 through a lid opening (not shown), the lid is closed, and the crucible is sealed, evacuated and filled with an inert gas, such as argon. However, other inert gases will also be sufficient such as helium, neon or krypton or other nobel gases. Referring to FIG. 5, the gas pressure is then raised to $P_0$ which is set at 300 to 750 Torr (but preferably 350 Torr) to inhibit transport of the source material 14 to the seed 12. After the pressure is raised, the seed crystal 12 and source material 14 are respectively established at condensation and sublimation temperatures. These temperatures are established after pressure is set at $P_0$ so that no transport of source material to the seed occurs yet.

The temperature of the source material $T_{source}$ is set higher than $T_{seed}$ but must be greater than 2200° C. to maintain sublimation and is preferably higher than 2300° C., and to the temperature of the seed crystal $T_{seed}$ is preferably set at 2300° C., creating a thermal gradient of 20° C./cm. In one successful test case, $T_{source}$ was held at 2360° C. and $T_{seed}$ at 2300° C. As shown in FIG. 5, the thermal gradient as well as the seed and source temperatures are held substantially constant throughout the entire growth period to prevent any significant variation in polytype. A consistent polytype structure provides an extremely high quality single crystal in that it provides consistent characteristics.

Next, the pressure is held at $P_0$ for a time to allow the system to achieve thermal stabilization or equilibrium (as shown in FIG. 5). This step is preferred since the SiC crystal growth system is very inertial (i.e. contains relatively large amounts of graphite in the crucible body), and the power of the heating systems such as HF or DC in resistor heating furnaces changes due to the requirements to heat the heavy carbon mass, which can cause a delay in controlling the temperatures in the crucible.

It will be appreciated that the process is called a constant temperature process because the temperature at the seed $T_{seed}$ for condensation remains constant over time, and the temperature for sublimation $T_{source}$ at the source material remains constant over time. $T_{seed}$ is preferably measured or calculated at the exposed surface of the seed crystal 12, and $T_{source}$ is preferably measured or calculated at the original top surface of the source material 14 by methods known in the art. While $T_{seed}$ and $T_{source}$ are constant during the growth period, a range of temperatures is established in the crucible at any one time, including a range within the seed crystal over its height, and a range within the source material over its depth. A thermal gradient also exists with a range of temperatures from the source to the seed as shown by the temperature chart on FIG. 1.

The next step in the process is a first preliminary growth step where the pressure is lowered in 0.5–1.5 hours to $P_1$ of about 10 to 50 Torr but preferably 50 Torr while maintaining the same constant temperatures (see FIG. 5). This pressure level provides a very slow ramp up of growth rate to about 0.5 mm/hr. The slow ramp up of growth rate (length per unit time) enables the formation of a high quality single crystal material on an the seed by preventing defect formations that occur with high initial growth rates at the seed interface.

Figure 2:
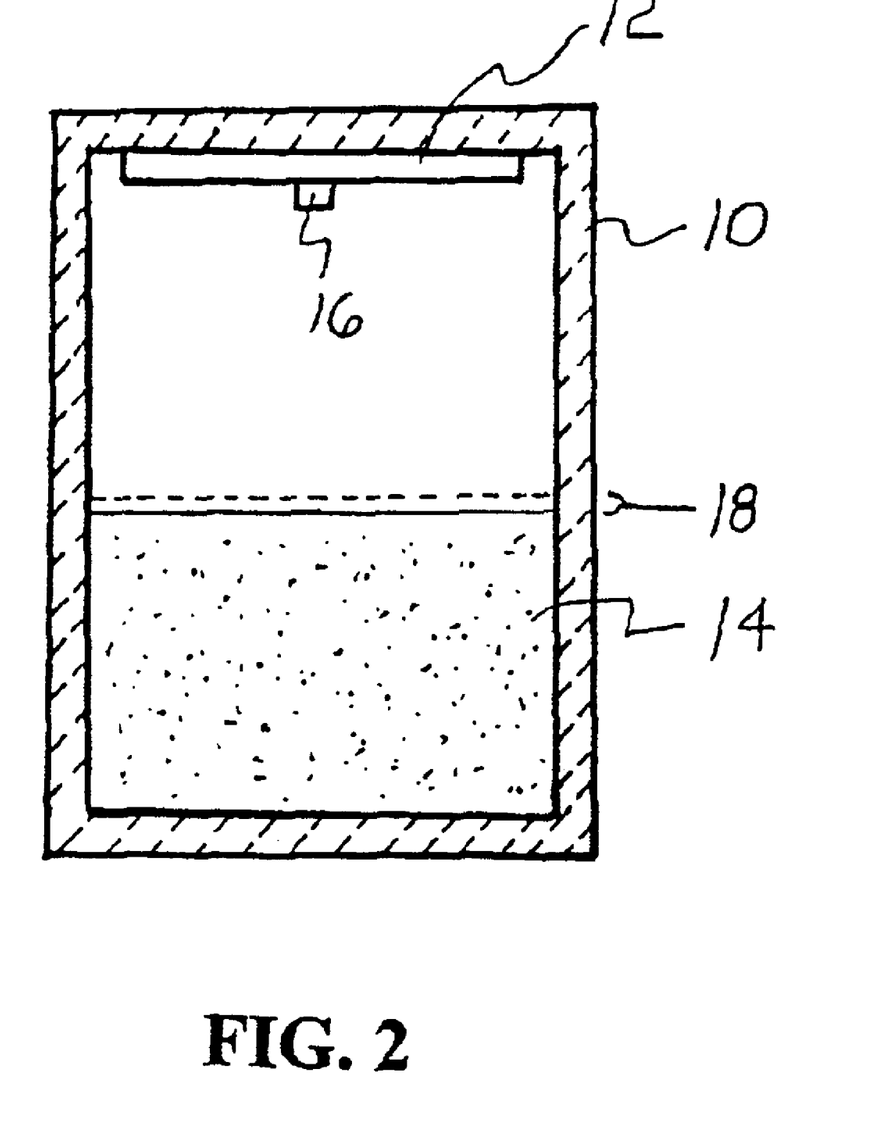
FIG. 2 is a simplified cross-sectional view of the crucible in accordance with another step of the method of the present invention.
Figure 3:
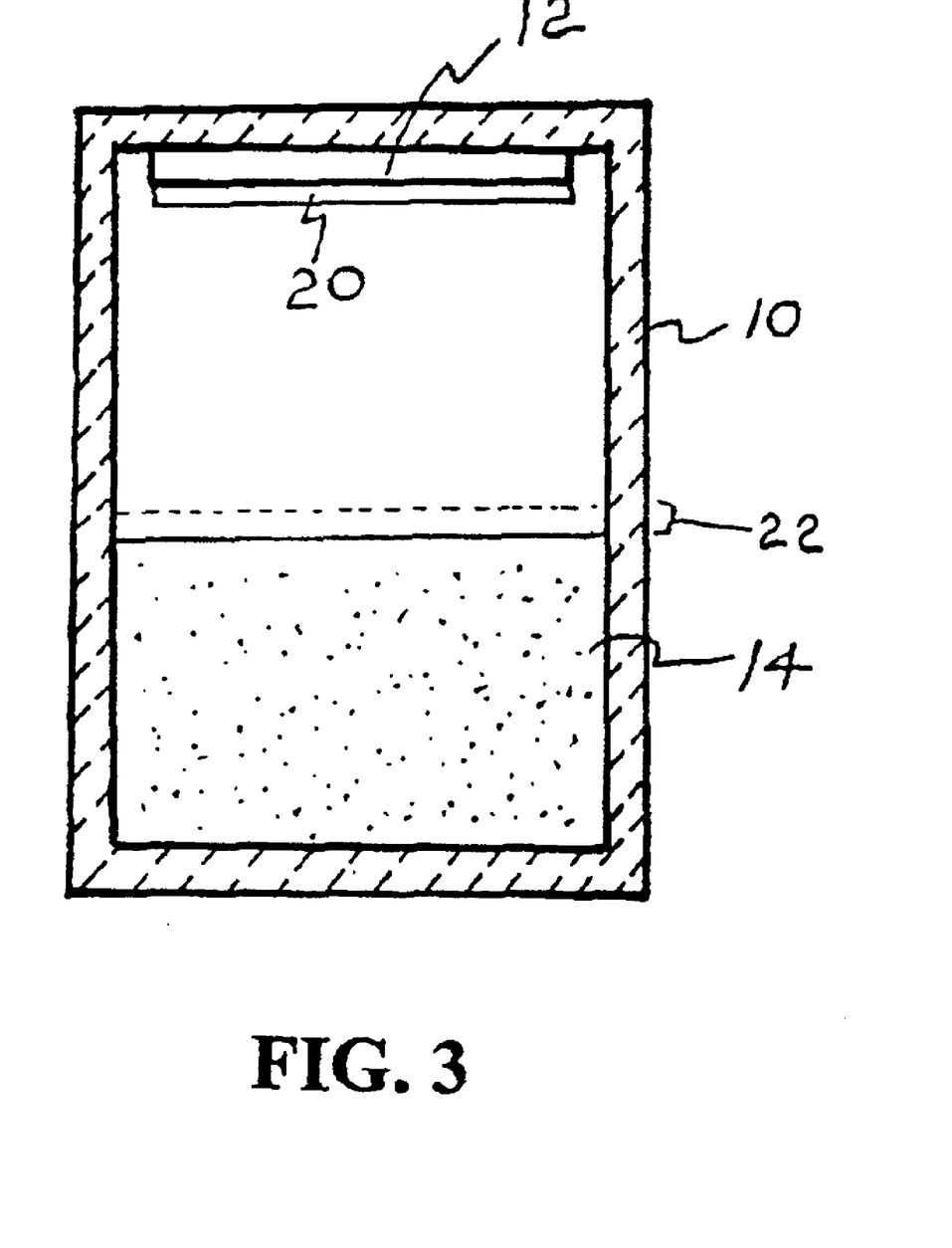
FIG. 3 is a simplified cross-sectional view of the crucible during yet another step of the method of the present invention.

As shown in FIGS. 2–3, the crystal grows laterally over the seed surface as well as vertically from it. As shown in FIG. 2, an initial crystal growth 16 is formed and grows laterally to form a base 20 of the growing single crystal as shown in FIG. 3 (the amount of sublimation is represented by depths 18 and 22 in FIGS. 2–3, respectively). By first allowing slow lateral growth over the seed surface, imperfections in the seed surface are filled in or smoothed over to provide the low defect base 20 on which to vertically grow the remainder of the single crystal. Thus, the lateral growth prevents the formation of macrodefects, such as inclusions, hexagonal voids and grain boundaries that could form micropipes, other structural defects or variations within the growing crystal structure.

In the preferred embodiment, the conditions for this step were carried out for more than 0.5 hours before the growth rate was increased. In a test case, the pressure was reduced from $P_0$ to $P_1$ in 0.75 hours.

Figure 4:
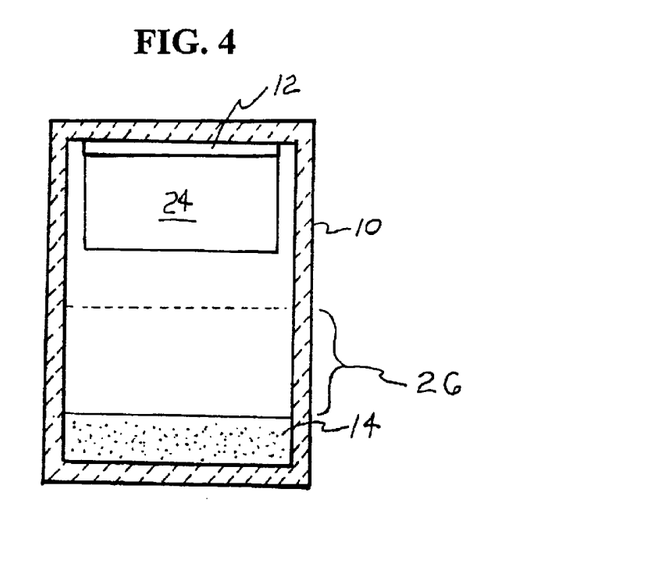
FIG. 4 is a simplified cross-sectional view of the crucible during still another step of the method of the present invention.

Once the high quality base of the crystal has accumulated enough mass, the growth rate can be increased to increase vertical growth on the crystal base. In this step, the pressure is lowered from $P_1$ to $P_2$ for about 3–8 hours for bulk vertical crystal growth (see FIG. 5). The pressure should be low enough to permit SiC vapor species to reach the growing crystal surface and provide a growth rate of about 0.1 to 2.0 mm/hr for at least 3 hours. The growth rate is preferably set at less than 1.0 mm/hr for a duration of 5 hours. Again, the temperatures $T_{seed}$ and $T_{source}$ remain the same throughout the entire growth process until a SiC single crystal 24 is fully grown as shown in FIG. 4 (the amount of sublimation of the source material is represented by depth 26).

During this step, for electrically conducted crystal production, doping gases ($N_2$ or other gases) may be gradually introduced. The dopant gas flow is stopped when the growth of the single crystal is terminated.

The growth is terminated by raising the pressure to $P_3$ (above 350 Torr) where the transport from the source to the seed is essentially stopped. To ensure the integrity of the grown single crystal, the system is cooled from $T_{source}$ and $T_{seed}$ down to room temperature only after the pressure has been raised to $P_3$. Pressure is finally raised to atmospheric pressure by filling air into the growth chamber to open the crucible.

In another aspect of the present invention, the process also preferably includes a preliminary degassing step before providing sublimation and condensation temperatures to expel residual air and other contaminating particles from the porous elements inside the crucible 10. This is accomplished by decreasing the pressure to $P_{degas}$ which is an extremely low level such as 0.2 Torr or lower. The temperature in the crucible is preferably higher than room temperature but lower than seed temperature. $P_{degas}$ may be held for a short time and then the pressure is raised to $P_0$ and the temperature of the seed crystal and source material may then be raised to begin the growth.

By using the process as described above, a high quality SiC single crystal was produced with a yield of less than 50 micropipes per $cm^2$. This is a 50% improvement over the typical prior art process that produces low quality SiC single crystals with over 100 micropipes per $cm^2$.

The advantages of the present silicon carbide crystal growth process are now apparent. The use of constant temperature difference throughout the growth period provides the source material to the seed in consistent polytypes. By adjusting pressure to first provide a low growth rate, the seed surface provides a base of the silicon carbide single crystal with few defects. The pressure can then be adjusted for the remainder for the growth resulting in a high quality silicon carbide single crystal.

While various embodiments of the present invention have been described, it should be understood that other modifications and alternatives can be made without departing from the spirit and scope of the invention, which should be determined from the appended claims.

What is claimed is:

1. A method of growing a silicon carbide single crystal on a silicon carbide seed crystal in an inert gas atmosphere in a vessel, comprising the steps of:
    establishing the seed crystal temperature to a growth temperature $T_{seed}$ and establishing the temperature of source material to a growth temperature $T_{source}$ that is higher than $T_{seed}$ to define a thermal gradient therebetween;
    maintaining constant seed temperature and constant source temperature throughout substantially the entire growth period of the single crystal, said entire growth period beginning when the seed crystal and source material reach $T_{seed}$ and $T_{source}$ respectively; and
    changing only the pressure of the inert gas during the entire growth period to control the growth rate of the single crystal.

2. The method according to claim 1, wherein said entire growth period includes a preliminary period for growing a base of the single crystal and a main period for growing a remaining portion of the single crystal, and wherein said step of changing the pressure includes:
    (a) establishing the pressure at a first pressure $P_1$ and holding the pressure at $P_1$ for a duration which is adequate to heal defects on the seed-crystal interface and to grow a base for the simple crystal on the seed for said preliminary period; and (b) after growing said base, further reducing the pressure from $P_0$ $P_1$ to a second pressure $P_2$ to continue growing the single crystal during said main period.

3. The method according to claim 2, wherein $P_1$ is selected from the range of approximately 10 to approximately 50 Torr, and $P_2$ is preselected to be less than about 10 Torr.

4. The method according to claim 2, wherein the pressure is held at $P_2$ for said remaining period of the entire growth period, until the pressure is raised to stop the growth.

5. The method according to claim 2, wherein said preliminary period of said entire growth period is at least 0.5 hours.

6. The method according to claim 1, further comprising the steps of:

first raising the gas pressure to a pressure $P_0$ that blocks transport of the source to the seed before the temperatures $T_{seed}$ and $T_{source}$ are obtained; and providing a period of stabilization where pressure at $P_0$ as well as temperatures $T_{seed}$ and $T_{source}$ are maintained before decreasing the pressure to begin growth of the crystal.

7. The method according to claim 1, further comprising the steps of:

at the end of the growth period, raising the pressure to stop the growth of the single crystal; and lowering the temperatures of the seed crystal and source material down to room temperature.

8. The method according to claim 1, further comprising a preliminary degassing step including the steps of;

before the growth period:

raising the temperature inside the vessel above room temperature but below 1600° C.; and lowering the pressure to a predetermined pressure $P_{degas}$ to remove contaminating particles from the vessel.

9. The method according to claim 8, wherein said $P_{degas}$ is equal to or less than 0.2 Torr.

10. A method of growing a silicon carbide single crystal in an inert gas environment in a vessel, comprising the steps of:

during an entire growth period, maintaining substantially constant seed crystal and substantially constant source material temperatures and only adjusting the pressure of said inert gas to change the growth rate of the single crystal, said growth period being defined as the period during which any transport of source material to seed crystal occurs.

11. The method according to claim 10, wherein said pressure is first lowered to a first pressure to grow a base of the single crystal and then lowered to a second pressure to grow a remaining portion of the single crystal.

12. A method of growing a silicon carbide single crystal in an inert gas environment in a vessel, comprising the steps of:

raising temperature of a SiC source material in a first zone in the vessel to a temperature sublimation of said SiC source material can occur thereby forming a vapor species, and maintaining temperature of an SiC seed crystal in a second zone in the vessel at a temperature where condensation of said vapor species can occur;

during an entire growth period, maintaining said seed crystal and said source material temperatures constant and only adjusting the pressure of said inert gas to change the growth rate of the single crystal; and lowering said seed crystal and said source material temperatures directly back down to room temperature after said entire growth period.

13. The method according to claim 12, wherein said entire growth period includes:

a preliminary period where pressure is first lowered to grow a base of the single crystal, and a main period where pressure is lowered further after said preliminary period to grow a remaining portion of the single crystal.

14. The method according to claim 12, wherein said temperatures of the seed and source material are temperatures that avoid super saturation and are sufficient to prevent the formation of macrodefects that significantly adversely affect a crystal lattice of the single crystal.

15. A method of growing a silicon carbide single crystal in an inert gas environment in a vessel, comprising the steps of:

raising temperature inside a first zone of the vessel with a source material that enables sublimation of said source material into a vapor species, and maintaining temperature of a second zone of the vessel with a seed crystal that enables condensation of said vapor species;

maintaining said source material and said seed crystal temperatures constant throughout an entire growth period of the single crystal; and changing the growth rate of the single crystal during the growth period only by adjusting the pressure of the inert gas, said entire growth period being defined from when pressure is first reduced to permit transport of source material to said seed crystal and to the time when said pressure is increased to end growth of the single crystal.

16. The method according to claim 15, wherein said temperatures of the seed and source material are temperatures that avoid super saturation and are sufficient to prevent the formation of macrodefects that significantly adversely affect a crystal lattice of the single crystal.

17. A method of growing high quality silicon carbide single crystals by physical vapor transport in an inert gas environment in a vessel, comprising the steps of:

(a) preheating including the substeps of:
(i) raising the pressure of the inert gas to a non-transport pressure that prevents mass transport of source material to the seed crystal,
(ii) heating a SiC source material to a sublimation temperature, and
(iii) maintaining an SiC seed crystal at a condensation temperature;

(b) stabilizing including the step of holding said seed crystal and said source material temperatures and said non-transport pressure for a duration sufficient to establish thermal equilibrium in the vessel;

(c) preliminary growth including the steps of:
lowering pressure of said inert gas to a first pressure without changing any temperature, and
holding said first pressure including the steps of
preventing macrodefect formation on a seed crystal surface, and
growing a base of the single crystal on the seed crystal at a first growth rate;

(d) main growth including the step of further lowering the pressure of the inert gas to a second pressure for continuing the growth of the single crystal at a second growth rate that is faster than said first growth rate;

(e) growth termination including the step of increasing the pressure to stop transport of source material to said seed crystal;

(f) cooling including the step of decreasing the temperature inside the vessel from said source material and said seed crystal temperatures; and (g) opening said vessel including the step of changing the pressure to equalize the pressure relative to pressure external to the vessel.

18. The method according to claim 17, wherein said step (c) lasts for at least 0.5 hours.

19. The method according to claim 17, further comprising a degassing step before step (a) where temperature inside the vessel is raised above room temperature but below said seed crystal temperature, and pressure is decreased to a level sufficient to remove air and contaminants from said vessel.

20. The method according to claim 17, wherein said step (d) further includes the step of introducing doping gases.

21. The method of claim 17, wherein said step (c) is maintained for approximately three hours and said step (d) is maintained for at least approximately 3 hours.

22. A method of growing a silicon carbide single crystal on a silicon carbide seed crystal in an inert gas atmosphere in a vessel, comprising the steps of:

establishing the seed crystal temperature to a growth temperature $T_{seed}$ and establishing the temperature of source material to a growth temperature $T_{source}$ that is higher than $T_{seed}$ to define a thermal gradient therebetween;

maintaining constant seed temperature and constant source temperature throughout substantially the entire growth period of the single crystal, said entire growth period beginning when the seed crystal and source material reach $T_{seed}$ and $T_{source}$ respectively; and changing the pressure of the inert gas without changing said temperatures and without moving either said seed crystal or said source material or both by mechanical means to change a thermal gradient between $T_{seed}$ and $T_{source}$ during the entire growth period to control the growth rate of the single crystal.

* * * * *